United States Patent
Sato

(10) Patent No.: US 12,515,946 B2
(45) Date of Patent: Jan. 6, 2026

(54) IMPRINTING METHOD, PRE-PROCESSING APPARATUS, SUBSTRATE FOR IMPRINTING, AND METHOD FOR MANUFACTURING SUBSTRATE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 19/004,922

(22) Filed: Dec. 30, 2024

(65) Prior Publication Data

US 2025/0136439 A1    May 1, 2025

Related U.S. Application Data

(63) Continuation of application No. 16/984,544, filed on Aug. 4, 2020, now Pat. No. 12,221,340.

(30) Foreign Application Priority Data

Aug. 29, 2019    (JP) ................. 2019-157234

(51) Int. Cl.
   *B81C 1/00*    (2006.01)
   *G03F 7/00*    (2006.01)
   *G03F 9/00*    (2006.01)

(52) U.S. Cl.
   CPC .......... *B81C 1/0046* (2013.01); *G03F 7/0002* (2013.01); *G03F 9/7084* (2013.01)

(58) Field of Classification Search
   CPC .... G03F 7/0002; G03F 9/7084; B81C 1/0046
   See application file for complete search history.

(56) References Cited

U.S. PATENT DOCUMENTS 8,967,991 B2    3/2015    Wuister et al.
2009/0224436 A1    9/2009    Mikami et al.
(Continued)

FOREIGN PATENT DOCUMENTS

JP    2006173508 A    6/2006
JP    4185941 B2    11/2008
(Continued)

OTHER PUBLICATIONS

Office Action issued in Korean Appln. No. 10-2020-0105163 mailed Jul. 26, 2024. English translation provided.
(Continued)

*Primary Examiner* — James M Mellott
(74) *Attorney, Agent, or Firm* — ROSSI, KIMMS & McDOWELL LLP

(57) ABSTRACT

Provided is an imprinting method suitable for positioning. The imprinting method includes: supplying an imprint material onto a substrate; bringing a patterned portion of a mold into contact with the imprint material, which has been supplied onto the substrate in the supplying of the imprint material, to form a pattern on the imprint material in a predetermined pattern region on the substrate; and increasing viscosity of the imprint material at a predetermined position, which includes a position of a predetermined mark provided on the substrate, other than the pattern region to be higher than viscosity of the imprint material in the pattern region after the supplying of the imprint material and before the bringing of the patterned portion into contact with the imprint material.

12 Claims, 14 Drawing Sheets

(56) References Cited

U.S. PATENT DOCUMENTS

| | | |
|---|---|---|
| 2011/0206852 A1 | 8/2011 | Shiode |
| 2012/0013042 A1 | 1/2012 | Ota |
| 2013/0078821 A1* | 3/2013 | Furutono .............. G03F 7/0002 |
| | | 264/447 |
| 2016/0332341 A1 | 11/2016 | Iwase et al. |
| 2018/0074419 A1 | 3/2018 | Jung |

FOREIGN PATENT DOCUMENTS

| | | |
|---|---|---|
| JP | 2009212449 A | 9/2009 |
| JP | 4448191 B2 | 4/2010 |
| JP | 2011029642 A | 2/2011 |
| JP | 2011176132 A | 9/2011 |
| JP | 2012020520 A | 2/2012 |
| JP | 2013069918 A | 4/2013 |
| JP | 2019075551 A | 5/2019 |
| KR | 1020160134466 A | 11/2016 |
| KR | 1020180003437 A | 1/2018 |

OTHER PUBLICATIONS

Office Action issued in U.S. Appl. No. 16/984,544 mailed on Jan. 29, 2024.
Office Action issued in U.S. Appl. No. 16/984,544 mailed on Sep. 19, 2024.
Notice of Allowance issued in U.S. Appl. No. 16/984,544 mailed on Oct. 23, 2024.

* cited by examiner

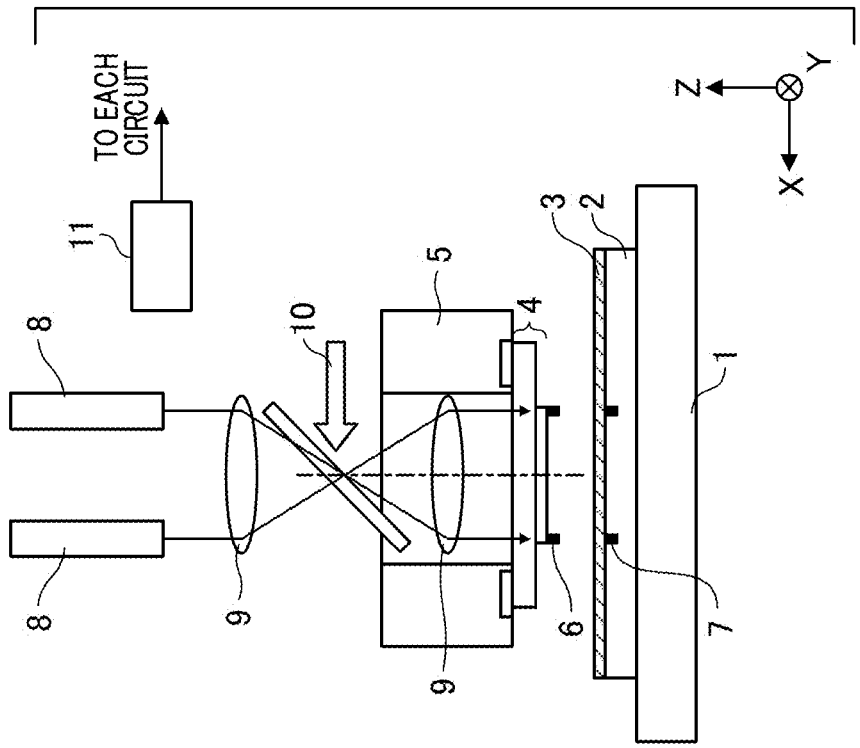
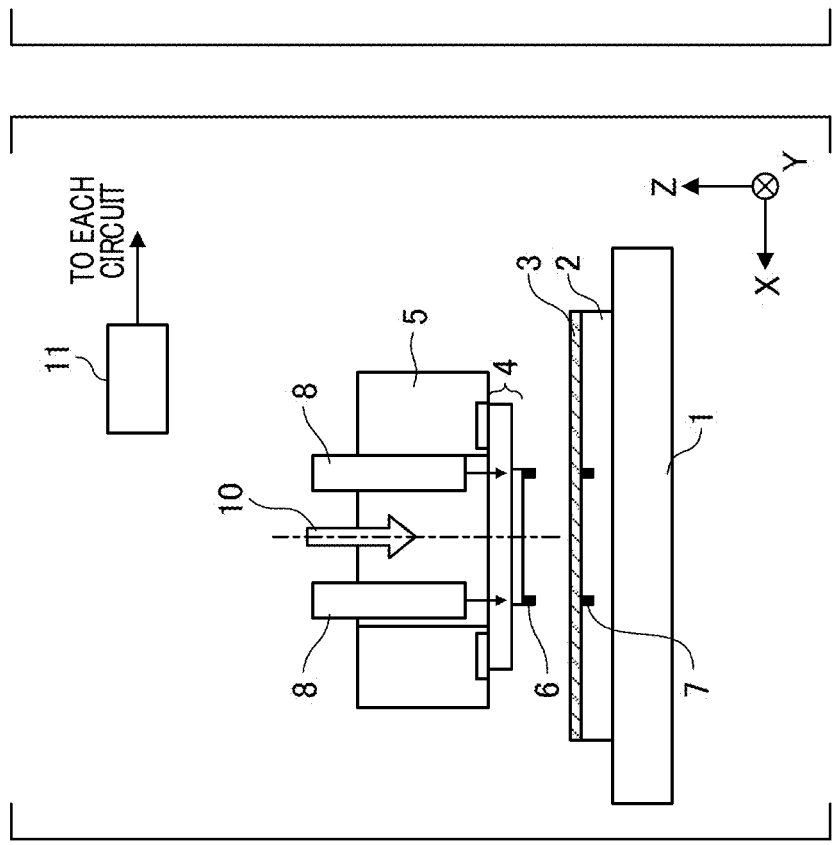

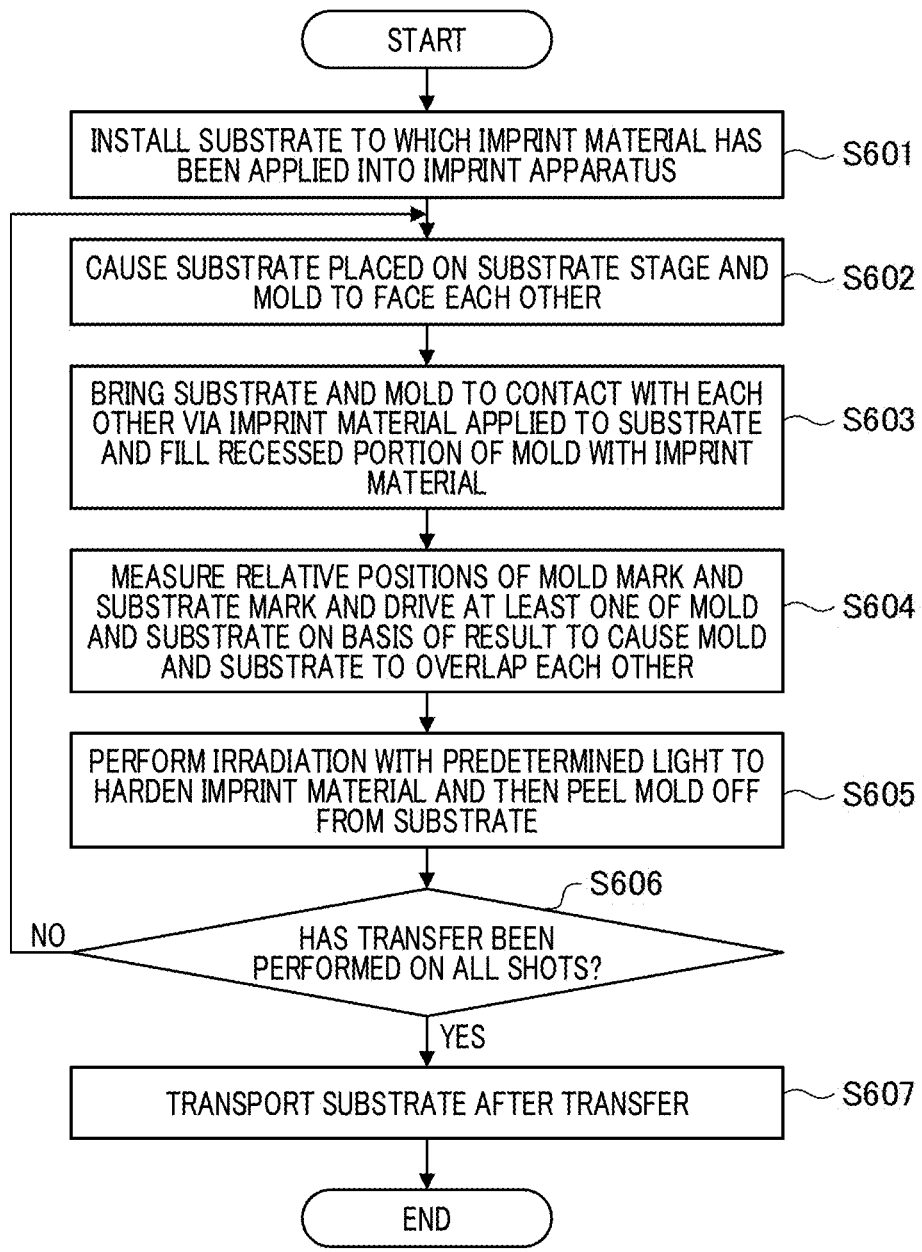

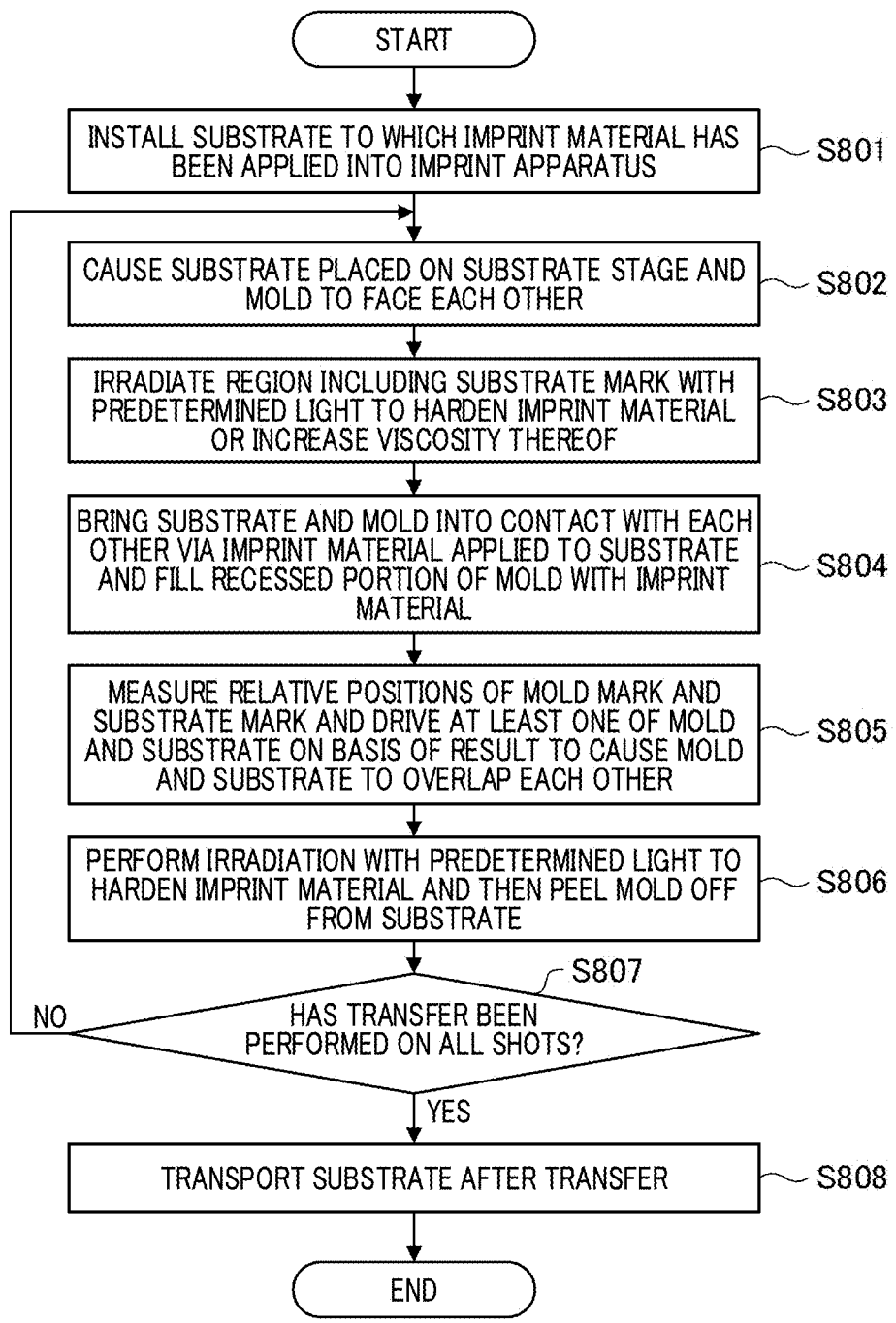

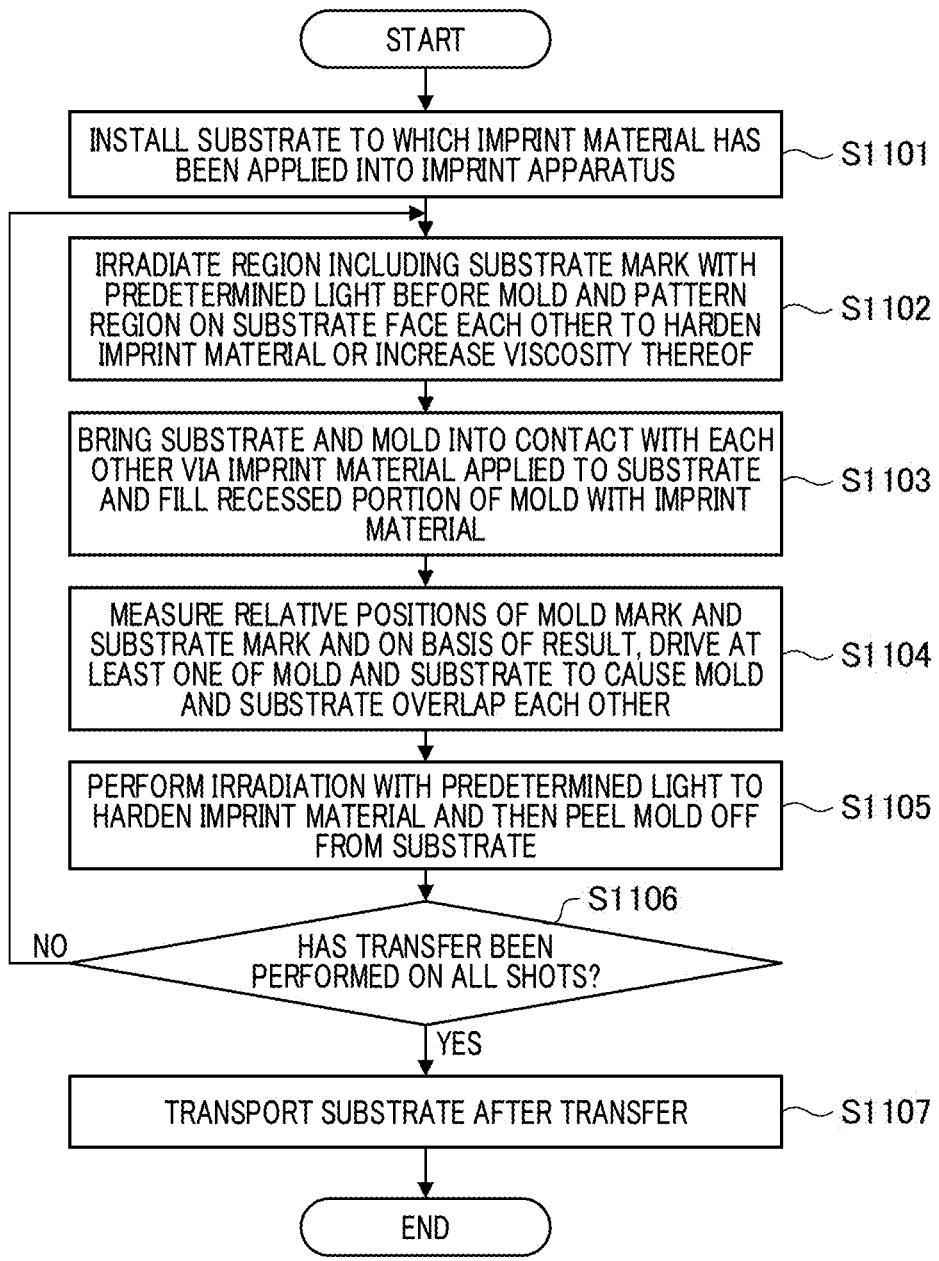

IMPRINTING METHOD, PRE-PROCESSING APPARATUS, SUBSTRATE FOR IMPRINTING, AND METHOD FOR MANUFACTURING SUBSTRATE

BACKGROUND OF THE INVENTION

Field of the Invention

The present invention relates to an imprinting method and the like suitable for alignment.

Description of the Related Art

As one process for manufacturing a device, there is a semiconductor exposure device configured to transfer a fine nanoscale pattern from an original plate onto a desired substrate. Conventionally, techniques for transferring a fine nanoscale pattern by optically projecting a pattern of an original plate in a reduced manner have been developed.

An imprinting technique is a technique that enables a fine nanoscale pattern to be transferred and is proposed as a nanolithography technology for mass production of semiconductor devices and magnetic storage media in Japanese Patent No. 4185941. An imprint apparatus using the imprinting technique transfers a pattern onto a substrate by hardening a resin (imprint material) in a state in which a mold having a patterned portion with a pattern formed thereon is pressed against the resin on the substrate and then separating the mold from the hardened resin.

For such an imprint apparatus, a die-by-die alignment scheme is employed as a scheme for alignment (positioning) of a mold and a substrate in many cases. The die-by-die alignment scheme is an alignment scheme in which a mark formed in each of a plurality of shot regions on a substrate is optically detected and deviation in a positional relationship between a substrate and a mold is corrected. At this time, a plurality of marks formed in the periphery of the shot regions and moire or the like caused by a plurality of marks formed in the periphery of patterned portion are detected in order to cause the shape of each shot region on the substrate and the shape of the patterned portion of the mold to conform to each other. Deviation of the shot regions (such as shifting, rotation, magnification, and the like) is obtained on the basis of the detected information.

In relative positioning, measurement is performed with the mold and the substrate in contact with each other via a resin. Therefore, there is a problem that if a material of the mold and the resin have similar physical property values, the mold mark cannot be seen at the time of the measurement because the mark of the mold is filled with the resin.

Thus, according to Japanese Patent No. 4448191, a mark portion is configured of another substance or another material (mark material) such that a mold mark can be observed even when the mold mark is filled with a resin.

However, there is a problem that the substance may peel off after the mold is washed or imprint is repeated, and this may be a factor that determines a lifetime of the mold. In addition, there is also a problem that the mold configured of another substance leads to an increase in cost of the mold.

SUMMARY OF THE INVENTION

The present invention provides an imprinting method suitable for positioning.

According to an aspect of the present invention, there is provided an imprinting method including: supplying an imprint material onto a substrate; bringing a patterned portion of a mold into contact with the imprint material, which has been supplied onto the substrate in the supplying of the imprint material, to form a pattern on the imprint material in a predetermined pattern region on the substrate; and increasing viscosity of the imprint material at a predetermined position, which includes a position of a predetermined mark provided on the substrate, other than the pattern region to be higher than viscosity of the imprint material in the pattern region after the supplying of the imprint material and before the bringing of the patterned portion into contact with the imprint material.

Further features of the present invention will become apparent from the following description of exemplary embodiments with reference to the attached drawings.

BRIEF DESCRIPTION OF THE DRAWINGS

FIGS. 1A and 1B are diagrams illustrating an imprint apparatus according to an embodiment.

FIG. 6 is a flowchart illustrating an imprinting sequence in the related art.

FIG. 8 is a flowchart according to a first embodiment.

FIG. 11 is a flowchart according to a second embodiment.

DESCRIPTION OF THE EMBODIMENTS

Figure 2:
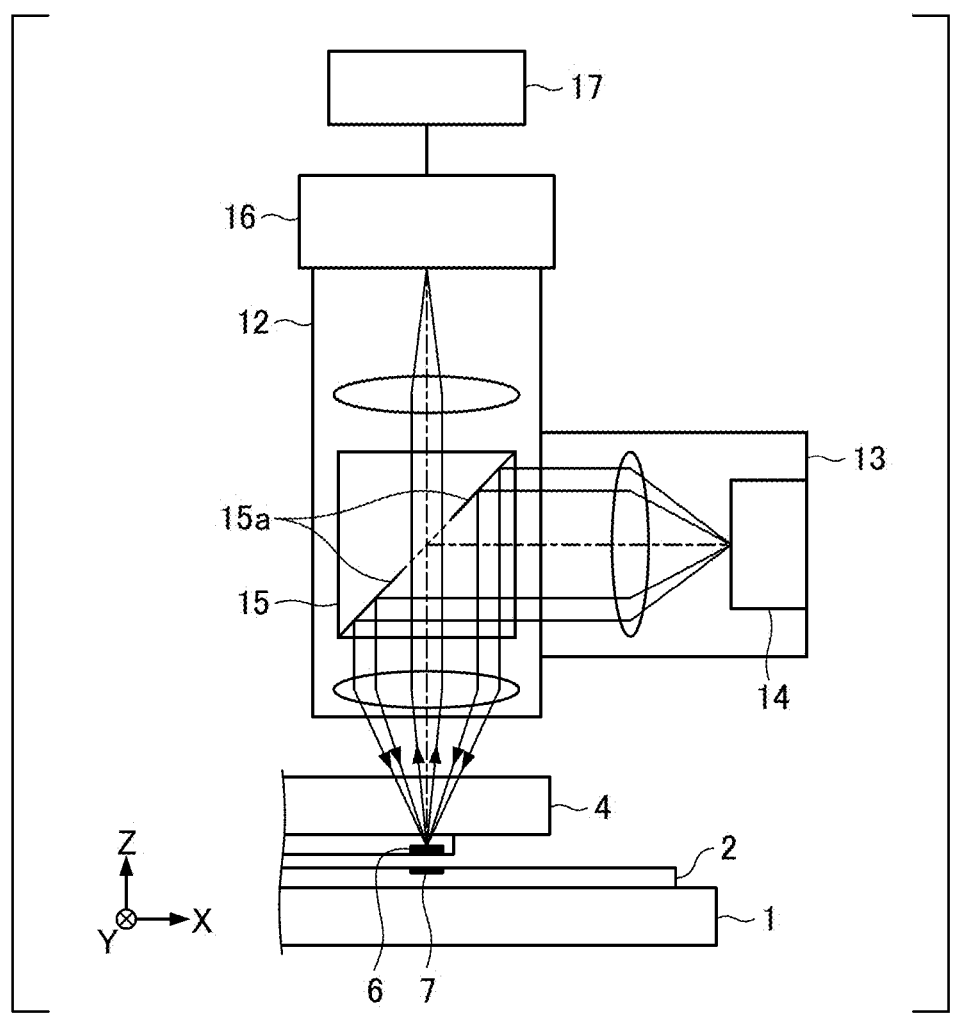
FIG. 2 is a schematic diagram illustrating an example of an apparatus configuration for detecting a mark position.

Hereinafter, preferred embodiments of the present invention will be described in detail with reference to accompanying drawings and examples.

First Embodiment

Referring to FIGS. 1A and 1B, a configuration of an imprint apparatus according to a first embodiment will be described. FIGS. 1A and 1B illustrate a configuration of the imprint apparatus according to the first embodiment. In imprint processing performed by the imprint apparatus according to the first embodiment, an imprint material (resin) 3 is supplied to a substrate 2 held by a substrate stage 1 through prior application or the like of the imprint material 3 to the entire surface of the substrate (supply process). Then, a patterned portion of a mold 4 with a desired uneven pattern configured thereon is brought into contact with the imprint material 3. After the contact, the imprint material is irradiated with light with a predetermined wavelength to harden the imprint material (hardening process), and the pattern is formed on the imprint material 3 in a predetermined pattern region (transfer shot region) on the substrate 2 (contact process). Thereafter, the mold 4 is separated from the hardened imprint material 3. In this manner, the three-dimensional pattern (uneven pattern) formed on the mold 4 is formed on the substrate 2. Note that the light with the predetermined wavelength is, for example, ultraviolet light 10. Note that the imprint material 3 may be hardened using heat in the hardening process.

The imprint apparatus according to the first embodiment includes a substrate stage 1 configured to hold the substrate 2, an imprint head (support element) 5 configured to hold the mold 4, a detector 8, and a control unit 11.

The substrate stage 1 holds and moves the substrate 2 using a vacuum adsorption force or an electrostatic force, for example. The substrate stage 1 can be moved by a drive mechanism (not illustrated) such as a linear motor or a piezoelectric actuator, for example. The drive mechanism may include a fine drive system for finely moving the substrate stage 1 and a rough drive system for moving the substrate stage 1 by a larger amount of movement than that of the fine drive system. The substrate stage 1 positions, for example, a shot region, on which imprint processing is to be performed, immediately below a supply unit (not illustrated) by holding the substrate 2 and moving the substrate 2 in an XY plane. Also, the substrate stage 1 positions the mold 4 and the substrate 2 in the direction of the XY plane when the mold 4 and the imprint material 3 on the substrate are brought into contact with each other. Note that the moving direction of the substrate stage 1 is not limited thereto and the substrate stage 1 may be configured to move in the X-axis direction, the Y-axis direction, the Z-axis direction, and rotation directions around the axes.

The substrate 2 is a substrate to which the imprint material 3 has been applied and has a predetermined mark (substrate mark 7) for positioning the mold 4 for forming a pattern relative to a predetermined pattern region on the substrate 2 in the imprint apparatus. In the first embodiment, the viscosity of the imprint material 3 at a predetermined position, which includes the position of the substrate mark 7, other than the pattern region is set to be higher than the viscosity of the imprint material in the pattern region on the substrate 2.

The imprint head 5 holds and moves the mold 4 using a vacuum adsorption force or an electrostatic force, for example. The imprint head 5 includes a drive mechanism such as a linear motor or an air cylinder, for example, and is configured to be able to drive the mold 4. Also, the detector 8 configured to detect a relative positional relationship between a mold mark 6 formed on the mold 4 and having an uneven pattern and the substrate mark 7 formed on the substrate 2 by optically observing moire or the like generated when the mold mark 6 and the substrate mark 7 face each other is disposed inside the imprint head 5.

The control unit 11 is connected to configuration members related to imprint processing such as the substrate stage 1, the imprint head 5, and the supply unit using a wired or wireless communication line to control operations of these configuration members. The control unit 11 includes a memory that stores a computer program for controlling various operations and further includes a CPU configured to execute the computer program. Note that the control unit 11 also functions as a control section.

In a case in which it is difficult to configure the detector 8 in the narrow space inside the imprint head 5 as in FIG. 1A, images of the mold mark 6 and the substrate mark 7 may be formed upward using an image forming optical system 9, and the images may be observed as in FIG. 1B.

Figure 9:
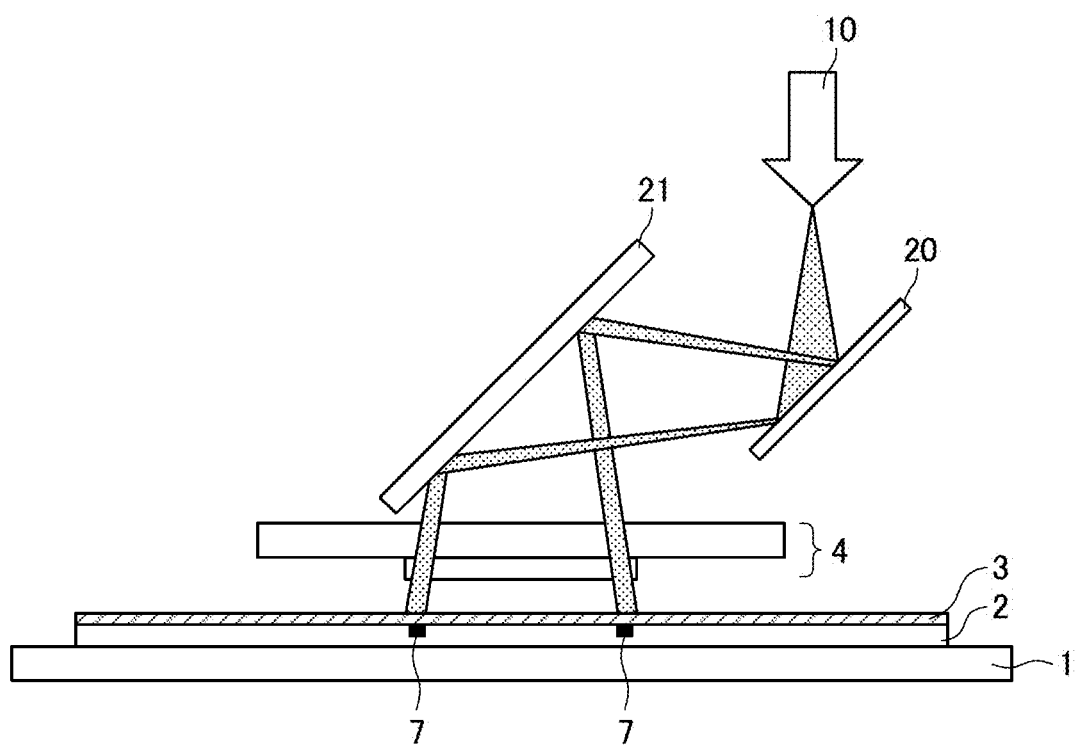
FIG. 9 is a diagram illustrating a unit configuration for irradiation with ultraviolet light in the first embodiment.

The imprint material 3 has a property of being hardened by light with a predetermined wavelength, for example, ultraviolet light 10, when the imprint processing is performed, and being hardened when illuminated (irradiated) with the ultraviolet light 10 from above the apparatus. As in FIG. 1B, an optical element 21 as illustrated in FIG. 9, which will be described later, may be configured inside the image forming optical system 9 to synthesize an optical path. In this case, it is only necessary to cause the optical element 21 to have a property of reflecting light with the wavelength of the ultraviolet light 10 and transmitting light with the wavelength of the detector 8. Note that the light with the wavelength of the ultraviolet light 10 may be transmitted and the light with the wavelength of the detector 8 may be reflected depending on an apparatus configuration.

FIG. 2 illustrates an example of an apparatus configuration for detecting the position of a mark. FIG. 2 illustrates that a part of a detection optical system 12 (an optical axis of the detection optical system) and a part of an illumination optical system 13 (an optical axis of the illumination optical system) are common.

The illumination optical system 13 guides light from a light source 14 to the same optical axis as that of the detection optical system 12 using an optical member such as a prism 15 and irradiates the mold mark 6 and the substrate mark 7 therewith. As the light source 14, a halogen lamp, an LED, or the like is used, for example. The light source 14 emits light with a wavelength that is different from the wavelength of the ultraviolet light 10.

The prism 15 has a reflection film 15a for reflecting light in a peripheral portion of a pupil surface of the illumination optical system 13 in an attachment surface. The reflection film 15a functions as an aperture diaphragm that defines the shape of pupil intensity distribution in the illumination optical system 13. Also, the reflection film 15a also functions as an aperture diaphragm that defines the size of the pupil in the detection optical system 12 (or the numerical apertures NAo in the detection optical system 12).

The prism 15 may be a half prism that has a semipermeable film in the attachment surface or may be replaced with a plate-shaped optical element with a reflection film provided thereon. Also, in order to change the pupil shapes in the illumination optical system 13 and the detection optical system 12, the prism 15 may be replaceable with another prism using a switching mechanism such as a turret or a sliding mechanism. Also, the position at which the prism 15 is disposed may not be in the pupil surfaces or the vicinity thereof in the detection optical system 12 and the illumination optical system 13. Note that, although the pupil shape of the illumination optical system 13 is defined by the reflection film 15a of the prism 15, the present invention is not limited thereto. For example, it is possible to obtain similar effects even if a mechanical diaphragm, a diaphragm depicted in a glass surface, or the like is disposed at the pupil position in the illumination optical system 13.

Figure 3:
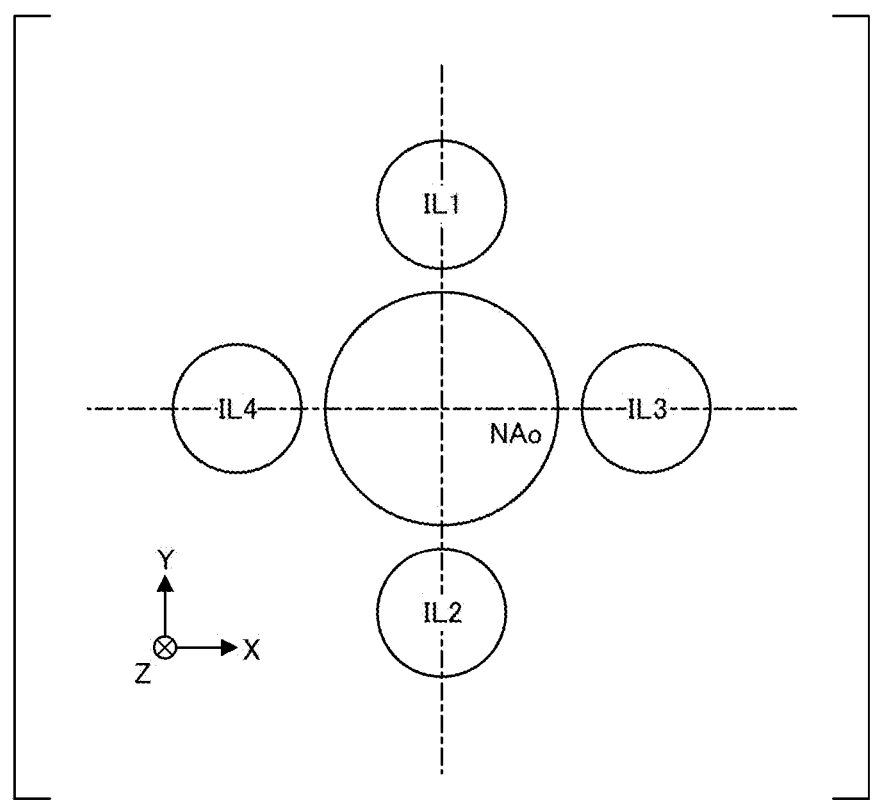
FIG. 3 is a diagram illustrating a relationship between pupil intensity distribution in an illumination optical system and the number of apertures in a detection optical system in a position detector.

FIG. 3 is a diagram illustrating a relationship between pupil intensity distribution (IL1 to IL4) in the illumination optical system 13 and the numerical apertures NAo in the detection optical system 12. In FIG. 3, the size of the pupil in the pupil surface in the illumination optical system 13 is represented by the numerical apertures NAo in the detection optical system 12.

In the first embodiment, the pupil intensity distribution in the illumination optical system 13 includes a first pole IL1, a second pole IL2, a third pole IL3, and a fourth pole IL4. The illumination optical system 13 illuminates the mold mark 6 and the substrate mark 7 with light that is incident in a direction perpendicular to the direction (first direction) in which patterns of the mold mark 6 and the substrate mark 7 are aligned and light that is incident in parallel to such a direction. As described above, it is possible to form the plurality of poles, that is, the first pole IL1 to the fourth pole IL4, from the one light source by disposing the reflection film 15a that functions as an aperture diaphragm in the pupil surface in the illumination optical system 13. In this manner, a plurality of light sources are not needed in a case in which the pupil intensity distribution having a plurality of poles (peaks) is formed.

Figure 4A:
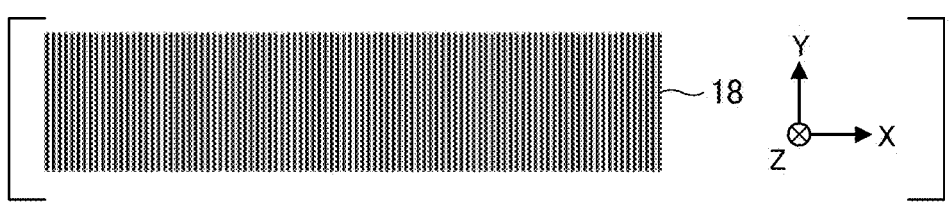
FIGS. 4A to 4D are diagrams for explaining a principle of generation of moire and detection of a relative position of a mark using the moire.
Figure 4B:
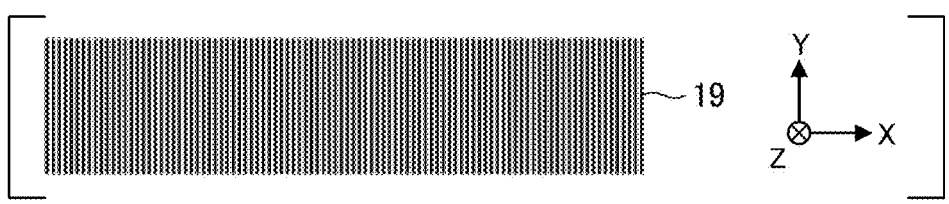

Referring to FIGS. 4A to 4D, a principle of generation of moire due to diffraction light from the mold mark 6 and the substrate mark 7 and detection of relative positions of the mold mark 6 and the substrate mark 7 using such moire will be described. As illustrated in FIGS. 4A and 4B, a diffraction grating (first diffraction grating) 18 provided on the mold 4 as the mold mark 6 and a diffraction grating (second diffraction grating) 19 provided on the substrate 2 as the substrate mark 7 have slightly different cycles of patterns (gratings) in the measurement direction. If such two diffraction gratings with mutually different grating cycles are caused to overlap, a pattern having a cycle reflecting a difference between cycles of the diffraction gratings, that is, so-called moire, appears due to an interference between the diffraction light from the two diffraction gratings. Since a phase of the moire changes due to the relative positions of the diffraction gratings at this time, it is possible to obtain the relative positions of the mold mark 6 and the substrate mark 7, that is, the relative positions of the mold 4 and the substrate 2, by detecting the moire.

Figure 4C:
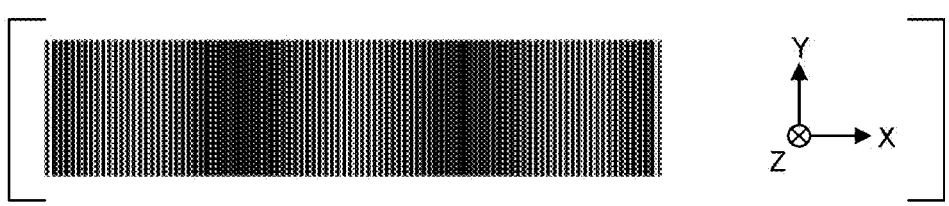
Figure 4D:
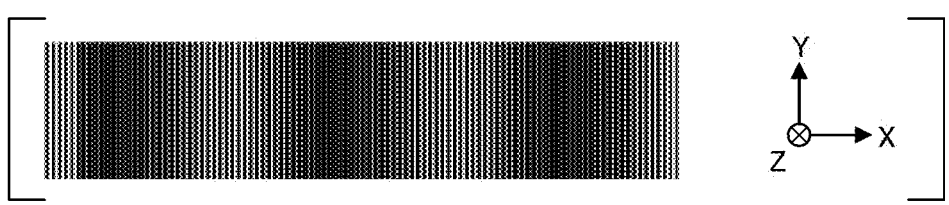

Specifically, if the diffraction grating 18 and the diffraction grating 19 with slightly different cycles are caused to overlap, then the diffraction light from the diffraction gratings 18 and 19 overlaps, and moire with a cycle reflecting the difference in cycles is thus generated as illustrated in FIG. 4C. The positions of brightness and darkness (streak phase) of the moire change depending on the relative positions of the diffraction grating 18 and the diffraction grating 19 as described above. If the relative positions of the diffraction grating 18 and the diffraction grating 19 change in the X direction, for example, the moire illustrated in FIG. 4C changes to the moire illustrated in FIG. 4D. Since the moire enlarges the amount of actual positional deviation (the amount of change) between the diffraction grating 18 and the diffraction grating 19 and is generated as a streak with a large cycle, it is possible to highly accurately detect the relative positions of the diffraction grating 18 and the diffraction grating 19 even if resolution of the detection optical system 12 is low.

Figure 5A:
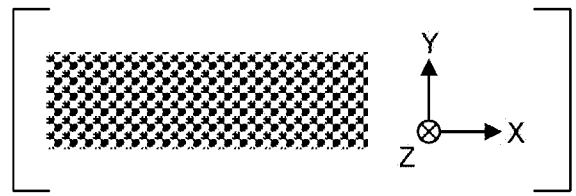
FIGS. 5A to 5D are diagrams illustrating an example of a diffraction grating provided on a mold and a substrate.

In order to detect such moire, a case in which the diffraction gratings 18 and 19 are detected in a bright field (the diffraction gratings 18 and 19 are illuminated from perpendicular directions, and diffraction light diffracted by the diffraction gratings 18 and 19 in the perpendicular directions is detected) will be considered. In this case, the detection optical system 12 detects zero-dimensional light from the diffraction gratings 18 and 19. Since the zero-dimensional light is strong, and this may lead to a relative decrease in contrast of the moire and cause the intensity to fall within sensor detection intensity, the imprint apparatus has a configuration of a dark field for not detecting the zero-dimensional light (in other words, the diffraction gratings 18 and 19 are illuminated by oblique incident light). In the first embodiment, one of the diffraction gratings 18 and 19 is a checkerboard-shaped diffraction grating as illustrated in FIG. 5A, while the other diffraction grating is the diffraction grating illustrated in FIG. 5B that enables detection of moire with the configuration of the dark field. The diffraction grating illustrated in FIG. 5A includes a pattern periodically aligned in the measurement direction (first direction) and a pattern periodically aligned in a direction (second direction) that perpendicularly intersects the measurement direction.

Figure 5B:
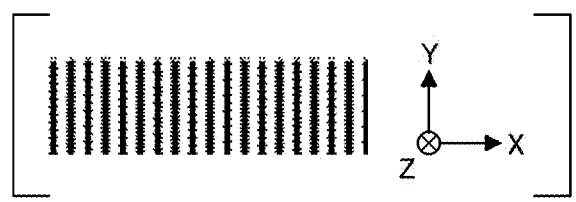

Referring to FIGS. 3, 5A, and 5B, the diffraction gratings are irradiated with light from the first pole IL1 and the second pole IL2, and the light is diffracted by the diffraction grating with the checkerboard shape. Here, light diffracted in the direction of the Z axis in the light diffracted by the diffraction grating is detected. Light diffracted in the Y direction has relative position information in the X direction, is incident on a detection region (NAo) on the pupil in the detection optical system 12, and is then detected by an image pickup element 16. Using this, the relative positions of the two diffraction gratings can be obtained.

Figure 5C:
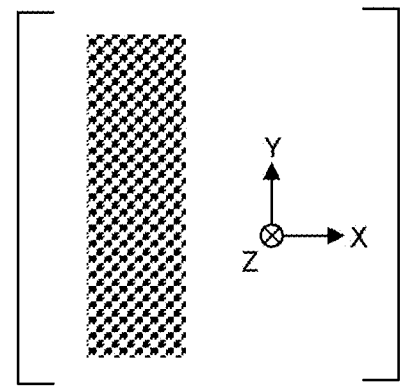
Figure 5D:
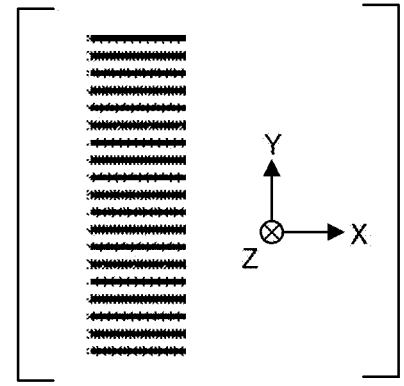

In the relationship between the pupil intensity distribution illustrated in FIG. 3 and the diffraction gratings illustrated in FIGS. 5A and 5B, light from the third pole IL3 and the fourth pole IL4 is not used to detect such relative positions of the diffraction gratings. However, in a case in which relative positions of the diffraction gratings illustrated in FIGS. 5C and 5D are detected, the light from the third pole IL3 and the fourth pole IL4 is used to detect the relative positions of the diffraction gratings while the light from the first pole IL1 and the second pole IL2 is not used to detect the relative positions of the diffraction gratings. Also, in a case in which the set of diffraction gratings illustrated in FIGS. 5A and 5B and the set of diffraction gratings illustrated in FIGS. 5C and 5D are disposed in the same field of view of the detection optical system 12, and the relative positions in the two directions are detected at the same time, the pupil intensity distribution illustrated in FIG. 3 is significantly effective.

FIG. 6 is a flowchart of an imprinting sequence in the related art. Using FIG. 6, the imprinting sequence in the related art will now be described. Note that the operations (processing) illustrated in the flowchart in FIG. 6 are controlled by the control unit 11 executing a computer program.

In the imprinting sequence in the related art, the imprint material 3 is applied to the substrate 2 first before the substrate 2 is transported into (installed in) the imprint apparatus. As the application, it is desirable that the imprint material 3 be uniformly applied to the entire surface of the substrate 2 by a spin coating method or the like that is typically used in a lithography apparatus or the like. Then, the substrate 2 with the imprint material 3 applied thereto in Step (process) S601 is transported into the imprint apparatus first.

Next, the substrate 2 that has been transported into the imprint apparatus is placed on the substrate stage 1 after the substrate 2 is allowed to acclimate to the temperature and after position measurement and the like. The substrate 2 placed on the substrate stage 1 moves on to an imprinting process after further position measurement and the like. It is assumed that the mold 4 is mounted in the imprint apparatus prior to this. A pattern to be transferred (pattern formation) onto the substrate 2 and the mold mark 6 that is a mark to be used for the positioning relative to the substrate 2 are configured on the mold 4. These are configured as an uneven structure on the mold 4. Then, in Step S602, the pattern region to be imprinted on the substrate 2 placed on the substrate stage 1 and the mold 4 are caused to face each other.

Next, in Step S603, the substrate 2 and the mold 4 are brought into contact with each other via the imprint material 3 applied in advance, and the recessed portion of the uneven portion of the mold 4 configured as the pattern and the mold mark 6 on the mold 4 is filled therewith.

Figure 7A:
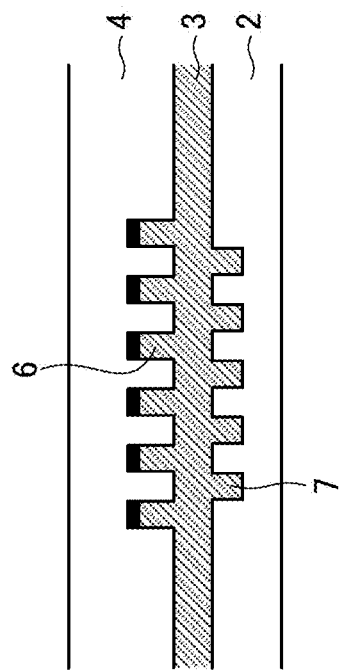
FIGS. 7A to 7D are diagrams illustrating how filling is carried out at the time of imprinting in the related art.
Figure 7C:
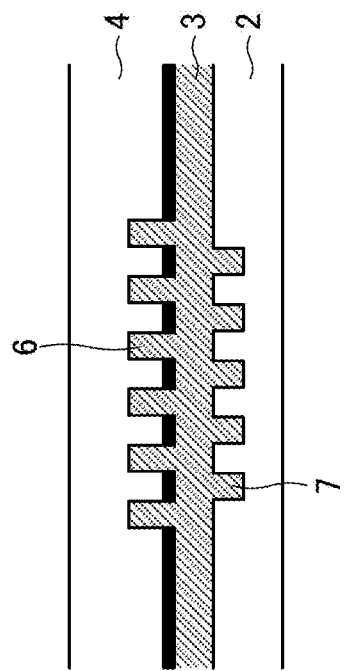
Figure 7B:
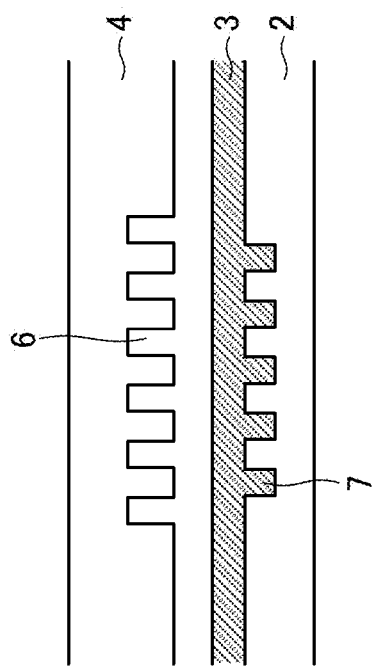

Here, FIGS. 7A to 7D illustrate how the filling with the imprint material 3 is performed in Step S603. FIG. 7A illustrates a state of the substrate 2 and the mold 4 before contact with a solution (before contact) via the imprint material 3. The state in which the imprint material 3 has been applied to the substrate 2 and the substrate 2 faces the mold 4 at this time is illustrated. FIG. 7B illustrates a state in which the substrate 2 and the mold 4 are brought into contact with each other via the imprint material 3. At this time, the recessed portion of the uneven portion (pattern formed portion) of the mold 4 is filled with the imprint material 3, and the mold mark 6 formed on the mold 4 is filled therewith, due to a capillary phenomenon. As described above, it is necessary to irradiate the imprint material 3 with the ultraviolet light 10 through the mold 4 in order to harden the imprint material 3. Therefore, a material that exhibits permeability with respect to the ultraviolet light 10, such as quartz, for example, is used for the mold 4. At this time, if the imprint material 3 and the mold 4 have similar values related to optical physical properties such as refractive indexes, it may be impossible or difficult to observe the mold mark 6, and a failure may occur in the measurement of the relative positions of the substrate 2 and the mold 4. Thus, the mold mark 6 configured of a material with different physical property values is used in the related art such that observation can be performed even when the recessed portion is filled.

Figure 7D:
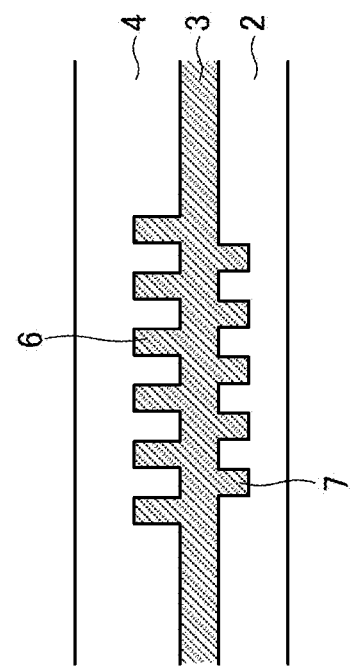

FIG. 7C illustrates a state in which the recessed portion of the mold mark 6 is configured of a different material through deposition or the like. FIG. 7D illustrates a state in which a surface portion (projecting portion) of the mold mark 6 is configured of a different material. Examples of the different material include Al, Cu, and Cr. In addition, similar effects can also be obtained by changing physical properties such as a refractive index and an absorption coefficient of the substrate 2 by injecting ions or the like, for example.

It is possible to observe the mold mark 6 even after filling the recessed portion or the surface portion by configuring the recessed portion or the surface portion of the mold mark 6 using the different material in this manner and thereby to perform the measurement of the relative position with respect to the substrate mark 7.

Returning to FIG. 6, at least one of the mold 4 and the substrate 2 is driven in Step S604 on the basis of the result of measuring the relative positions of the mold mark 6 and the substrate mark 7. Then, the mold mark 6 and the substrate mark 7 are positioned to achieve a desired amount of overlapping.

Once the positioning of the mold mark 6 and the substrate mark 7 in Step S604 ends, the region of the substrate mark 7 and the pattern region are irradiated with the ultraviolet light 10 to harden the imprint material 3 in Step S605 (hardening process). Thereafter, the mold 4 is peeled off from the substrate 2, thereby ending the transfer of the uneven pattern of the mold 4 onto the substrate 2.

Next, whether or not the transfer onto the entire pattern region, to which the transfer is to be performed, on the substrate 2 has ended is determined in Step S606. If a pattern region to which the pattern has not yet been transferred remains, the pattern region on the substrate 2 is driven to be located below the mold 4, and imprint processing in Steps S602 to S605 is carried out. If the pattern has been transferred to the entire pattern region, to which the transfer is to be performed, the processing proceeds to Step S607, the process for imprinting on the substrate 2 ends, and the substrate 2 is then transported out of the imprint apparatus. After the transport, processing on the following substrate is started.

Although the imprinting process in the related art has been described above, it is not possible to perform the measurement of the relative positions of the mold mark 6 and the substrate mark 7 during the filling with the imprint material 3 without the additional structure for the mold mark 6 as illustrated in FIGS. 7A to 7D.

However, a phenomenon in which such a structure is gradually worn or ground and disappears in a case in which each pattern region is filled with the imprint material 3 or in a case in which the mold 4 is regularly washed is seen. This may be a factor that determines a usable period (lifetime) of the mold 4. The mold 4 is expensive, and a method providing a structure capable of withstanding longer-term use is needed in consideration of manufacturing costs of the device using the imprint apparatus.

Further, a measurement signal of the mold mark 6 may not be stable in the process of the filling with the structure illustrated in FIGS. 7A to 7D. This is because the recessed portion of the mold 4 is filled with the imprint material 3, the structure of the mold mark 6 thus changes, and this causes a change in the detection signal. Although it is desired to perform the relative positioning as quickly as possible in order to enhance producibility, it is necessary to start the measurement of the mold mark 6 after sufficient filling of the mold mark 6 with the imprint material 3 ends due to the aforementioned phenomenon.

The method according to this embodiment illustrated in FIG. 8 can be said to be effective for solving these problems that may occur in the imprinting process in the related art. Hereinafter, an imprinting sequence according to the first embodiment will be described using FIG. 8. Note that the operations (processing) illustrated in the flowchart in FIG. 8 are controlled by the control unit 11 executing a computer program.

FIG. 8 is a diagram illustrating an imprinting sequence according to the first embodiment. Since steps up to S801 and S802 are similar to steps S601 and S602 illustrated using FIG. 6, description will be omitted. Note that it is preferable to have accurate position information in S803 in order to irradiate a desired position with light. Therefore, the process of positioning the predetermined marks is preferably performed in S802 that is a step in which the substrate 2 and the mold 4 are caused to face each other.

In Step S803, the imprint material 3 at a predetermined position, which includes the position of the substrate mark 7 that is a predetermined mark, outside the pattern region is irradiated with light with a predetermined wavelength to completely harden the imprint material 3 or increase the viscosity thereof (viscosity increasing process). In this case, the viscosity thereof is increased to be higher than the viscosity of the imprint material 3 in the pattern region.

FIG. 9 illustrates how Step S803 that is a process of increasing the viscosity of the imprint material 3 at the predetermined position in the mark region is carried out. In FIG. 9, an optical mechanism 20 is configured in addition to the configuration of the imprint apparatus in the related art illustrated in FIGS. 1A and 1B.

The drawing illustrates that the optical mechanism 20 reflects only predetermined ultraviolet light in the ultraviolet light 10 that can harden the imprint material 3 to expose (irradiate) the region including the substrate mark 7 in a limited manner. Examples of the optical element 21 include a digital micromirror device (DMD). This is an optical mechanism configuring multiple movable minute mirror surfaces and can reflect desired light at a desired angle. By using this, it is possible to reflect, at a desired angle, only light necessary to illuminate the predetermined region, which includes the substrate mark 7, other than the pattern region in the ultraviolet light 10 with which the optical mechanism 20 is illuminated.

The method for irradiating the region including the substrate mark 7 with the ultraviolet light 10 is not limited thereto. For example, a system configuring an illumination field diaphragm at a position conjugated with the substrate surface and adapted to irradiate the desired position with the ultraviolet light 10 by transmitting the ultraviolet light 10 through a portion corresponding to the position of the substrate mark 7 may also be used. Alternatively, a system adapted to drive an irradiation position by guiding light using an ultraviolet LED, a fiber, or the like to irradiate the region including the substrate mark 7 may also be used.

The optical element 21 preferably configures a dielectric multilayer film that reflects the ultraviolet light 10 and transmits visible light, for example. Since the ultraviolet light 10 is reflected by the optical element 21 using this, the substrate 2 is irradiated therewith. Also, since the visible light is transmitted through the optical element 21, there is an advantage that it is possible to use the optical mechanism 20 using the visible light to observe the state of the substrate 2, observe and relatively position the mold 4 and the substrate mark 7, and the like. It is thus possible to perform measurement for specifying the mark position at the time of the irradiation. For example, it is possible to check the positional relationship between the ultraviolet light irradiation unit and the mold 4 by measuring and recognizing the relative positions of the imprint apparatus and the mold 4 when the mold 4 is installed. If the relative positions of the mold mark 6 and the substrate mark 7 are measured when the mold 4 and the pattern region on the substrate 2 face each other next, it is possible to substantially specify the irradiation position. Since the imprint material 3 at the predetermined position, which includes the position of the substrate mark 7 that is the predetermined mark, other than the pattern region is hardened or the viscosity thereof is increased in a state in which the mold 4 and the substrate 2 face each other in this manner, it is possible to irradiate a targeted position of the imprint material 3 with the light with the predetermined wavelength.

Note that, although the region including the substrate mark 7 is irradiated with the light with the predetermined wavelength in S803, there is a possibility that hardening is not sufficiently performed if the total amount of irradiation (amount of exposure) of the imprint material 3 in this region is insufficient in S803 to S806 as will be described later. In addition, there is also a concern of the unhardened portion being pulled and peeled off together when the mold 4 is pulled and peeled off from the substrate 2 if the hardening of the imprint material 3 is not sufficiently performed. If etching or the like is performed thereon in the following process thereafter, a layer thickness that is different from that of the other region may be obtained, and the etching may be performed in an unexpected manner. In addition, it is also conceivable that a difference may occur in a degree of hardening of the imprint material 3 due to the difference in the amount of irradiation, and distortion (irregularity occurs) may occur.

It is thus desirable that the amount of irradiation obtained by adding the amount of prior irradiation with the light with the predetermined wavelength for the substrate mark 7 and the amount of irradiation with the light with the predetermined wavelength for the substrate mark 7 in the hardening process be equal to or greater than the amount of irradiation with the light with the predetermined wavelength for hardening the entire surface of the imprint material 3 in the pattern region in the hardening process. Also, since the portion in which each mark is configured is a region that is typically called a scribe line and includes no device pattern, it is desirable that the amount of irradiation obtained through the addition be equal to or greater than the amount of irradiation of the patterned portion as long as the distortion does not affect performance. Note that, in the irradiation, a region that includes not only the substrate mark 7 but also the periphery of the substrate mark 7 may be irradiated.

Returning to FIG. 8, the mold 4 is then brought into contact with the imprint material 3 that has been supplied to the substrate 2, the region of which including the substrate mark 7 has been irradiated, in Step S804.

Figure 10A:
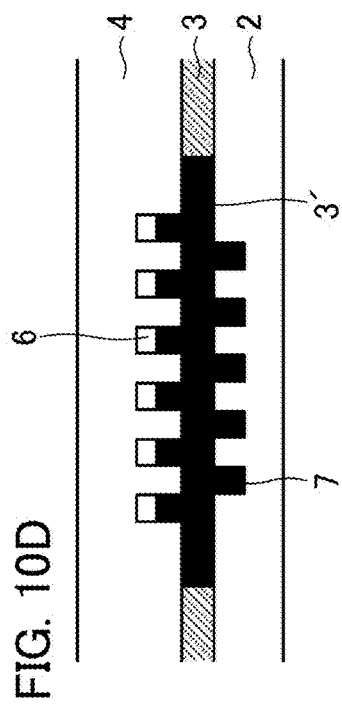
FIGS. 10A to 10F are diagrams illustrating how imprinting is carried out in the first embodiment.

FIGS. 10A to 10F specifically explain the state of the region including the substrate mark 7 at this time. FIG. 10A illustrates a state in which the imprint material 3 is applied onto the substrate mark 7 on the substrate 2 in advance and the substrate mark 7 faces the mold mark 6. At this time, the viscosity of the imprint material 3 is still low, and if the substrate 2 and the mold 4 are directly brought into contact with the solution similarly to the related art, the recessed portion of the mold mark 6 is filled with the imprint material 3 due to a capillary force.

Figure 10B:
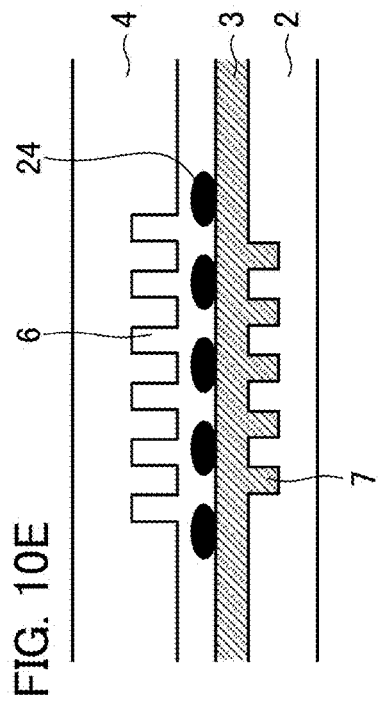
Figure 10C:
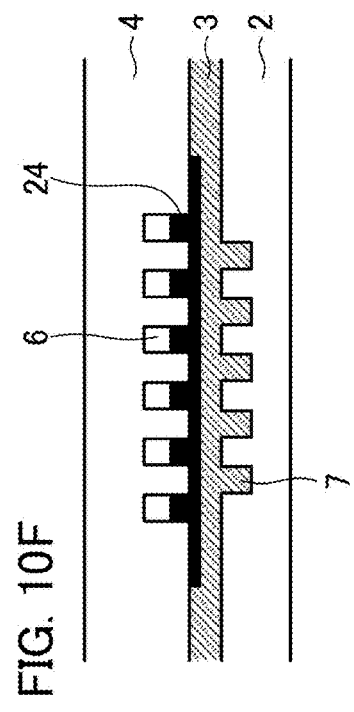

Thus, FIG. 10B illustrates the state of the region including the substrate mark 7 after the region is irradiated with the ultraviolet light 10 using the aforementioned mechanism illustrated in FIG. 9. An ultraviolet light irradiation region 3' represents the region that has been irradiated with the ultraviolet light 10. Since the ultraviolet light irradiation region 3' is in a state after the ultraviolet curable imprint material 3 has been irradiated with the ultraviolet light 10, a hardened state is illustrated. Even if the mold mark 6 is brought into contact with this region at the time of the imprinting, the imprint material 3 does not enter the furthest part of the recessed portion of the mold mark 6 because the imprint material 3 is hardened. FIG. 10C illustrates this state. Since a difference in physical property values (difference in refractive indexes) occurs in a portion of the recessed portion of the mold mark 6 that has not been filled in this manner, it is possible to observe the mold mark 6. Note that, in S803, it is only necessary to cause the imprint material 3 to have such viscosity that the imprint material 3 does not enter the furthest part of the recessed portion of the mold mark 6 in S805 in the first embodiment. In other words, it is possible to sufficiently perform positioning as long as the furthest portion of the recessed portion of the mold mark 6 is not completely filled with the imprint material 3 in S805 after the mold 4 and the imprint material 3 are brought into contact with each other and the furthest portion of the recessed portion of the pattern on the mold 4 is completely filled with the imprint material 3 in S804. Therefore, it is not necessary to completely harden the imprint material 3 when the viscosity thereof is increased in S803, and it is only necessary to increase the viscosity to such an extent that the furthest portion of the recessed portion of the mold mark is not completely filled with the imprint material 3 in S805.

Figure 10D:
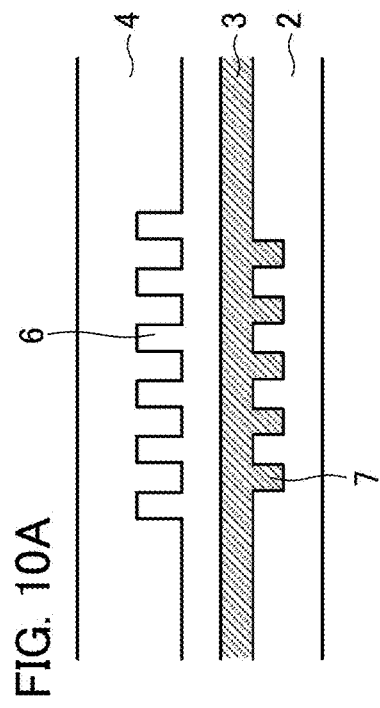

FIG. 10D illustrates such a state in which contact into the solution has been achieved with the imprint material 3 not completely hardened and with the viscosity increased. Although the imprint material 3 has not been completely hardened and the mold mark 6 has partially been filled with the imprint material 3 as described above, the portion that has not yet been filled therewith is present at the furthest portion of the recessed portion of the mold mark 6, and it is thus possible to observe the mold mark 6.

As described above, the viscosity of the imprint material 3 at the predetermined position other than the pattern region is increased to be higher than the viscosity of the imprint material 3 in the pattern region before the mold 4 is brought into contact with the imprint material 3 in the pattern region on the substrate 2. In this manner, the mold mark 6 is unlikely to be filled with the imprint material 3 when the mold 4 is brought into contact with the imprint material 3, and it is thus possible to continue the positioning. Note that it is desirable to increase the viscosity of the imprint material 3 at the predetermined position to obtain such viscosity that the recessed portion of the mold mark 6 is not completely filled with the imprint material 3 even after twice the time required to form the pattern of the mold 4 on the imprint material 3 elapses, for example.

Returning to FIG. 8, the processing proceeds to S805 next. However, since Steps S805 to S808 are similar to Steps S604 to S607 illustrated using FIG. 6, description thereof will be omitted.

By performing the aforementioned processes, it is not necessary to add a structure needed for the imprinting process in the related art to the mold mark 6. Also, if both the addition of a structure to the mold mark 6 and the method according to the first embodiment are employed together, the detection signal from the mold mark 6 becomes strong, and the mold mark 6 is more easily detected. In addition, since it is possible to maintain the minimum necessary intensity of the signal for detecting moire even in a case in which signal intensity decreases due to wearing of the additional structure for the mold 4, this leads to elongation of the lifetime of the mold 4.

Note that, in a case in which the structure as described above is added to the mold mark 6, the amount of ultraviolet light (the amount of irradiation) used in the irradiation for hardening after transferring the pattern may decrease. If the amount of ultraviolet light decreases, the amount of irradiation for the hardening after the pattern transfer may become insufficient, and there is a possibility of this causing irregularity in a degree of hardening of the imprint material 3 and a failure occurring in the following processes. Therefore, the ultraviolet light 10 is irradiated in advance, and the total amount of irradiation light is controlled as in the first embodiment. It is thus possible to adjust a balance between the amount of ultraviolet light applied to the imprint material 3 in the region of the substrate mark 7 and the amount of ultraviolet light 10 applied to the pattern region other than the region of the substrate mark.

Also, there is a case in which a phenomenon of the imprint material 3 rising along the mold side surface when the mold 4 is brought into contact with the imprint material 3 occurs due to wettability of the side surface of the mold 4 and surface tension of the imprint material 3. If the imprint material 3 is irradiated with the ultraviolet light 10 and is hardened in the hardening process with the imprint material 3 rising, the imprint material 3 with a projecting shape remains at an end of the mold. In order to avoid this, the outer peripheral portion of the pattern region may be irradiated with the ultraviolet light 10 before the contact with the solution to harden the imprint material 3 or increase the viscosity thereof. In other words, the imprint material 3 in the region including the substrate mark 7 may be irradiated with the ultraviolet light 10 to increase the viscosity, and the outer peripheral portion in the pattern region may be irradiated with the ultraviolet light 10 in S803. At this time, the viscosity of the imprint material 3 in the outer peripheral portion of the pattern region may be increased to be higher than the viscosity of the imprint material 3 in the pattern region inside the outer peripheral portion before the hardening process. Also, in this case, the irradiation with the ultraviolet light 10 may be performed on both the outer peripheral portion of the pattern region and the inside of the pattern region in S806.

Although the method of irradiating the imprint material 3 with the ultraviolet light 10 in advance in the imprinting method using the imprint material 3 that is hardened with the ultraviolet light 10 has been proposed as a method of hardening the imprint material 3 or increasing the viscosity thereof in the region including the substrate mark 7 in the first embodiment, the present invention is not limited thereto. In a case in which a thermosetting resin is used, for example, similar effects can be obtained by applying heat to the region including the portion of the substrate mark 7 through irradiation with infrared light or the like. Also, the method of irradiating the imprint material 3 with infrared light may be used instead of the irradiation with the ultraviolet light 10 as described above in the process of hardening the imprint material 3 or increasing the viscosity thereof in the outer peripheral portion of the pattern region as well.

Figure 10E:
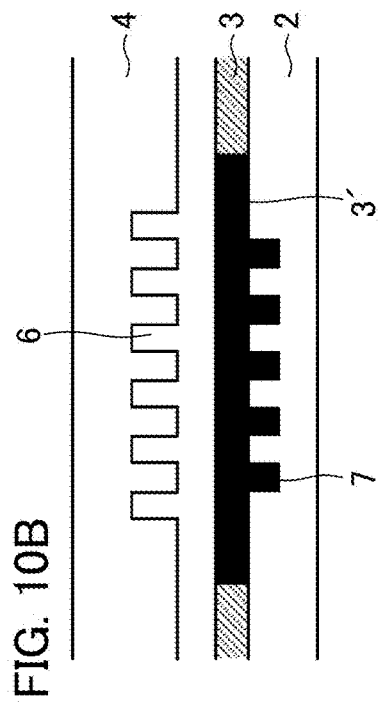
Figure 10F:
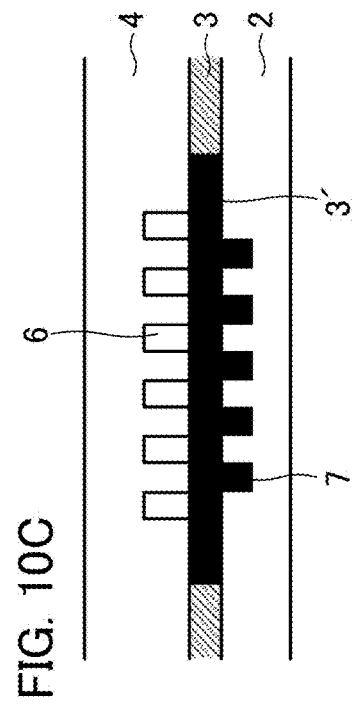

In addition, similar effects can also be obtained by additionally dropping the imprint material (resin) 24 with higher viscosity at a desired position of the imprint material 3 that has been applied to the entire surface of the substrate 2 in advance. FIG. 10E illustrates how the imprint material 24 with higher viscosity, with which it is difficult to fill the substrate mark 7, is additionally dropped onto the substrate mark 7 as illustrated in the first embodiment. Also, the state illustrated in FIG. 10F is a state in which the mold 4 has been brought into contact with the substrate 2 in the state in FIG. 10E. The filling of the mold mark 6 is curbed due to the imprint material 24 with higher viscosity that is additionally dropped, and it is possible to keep the unfilled state.

The imprint material 3 may be hardened, or the viscosity thereof may be increased, by applying a compound 25 that promotes polymerization of the imprint material 3 that has been applied in advance to the region, which includes the substrate mark 7, other than the pattern region using a similar method. As the application method, a method similar to that in FIG. 10E may be used. Also, the method illustrated in FIGS. 10E and 10F is also included in the viscosity increasing process for hardening the imprint material 3 or increasing the viscosity thereof.

Second Embodiment

Next, an imprinting method according to a second embodiment will be described on the basis of FIG. 11. FIG. 11 is a flowchart illustrating the imprinting method according to the second embodiment. Note that the operations (processing) illustrated in the flowchart in FIG. 11 are controlled by the control unit 11 executing a computer program.

First, in Step S1101, a substrate 2 with the entire surface to which an imprint material 3 is applied is prepared and is then installed in the imprint apparatus. Next, in Step S1102, a region including a substrate mark 7 is irradiated with ultraviolet light 10 to harden the imprint material 3 or increase the viscosity thereof at a predetermined position until the mold 4 and the pattern region of the substrate 2 face each other, that is, in a state in which the substrate 2 and a mold 4 do not face each other.

Irradiation with the ultraviolet light 10 in the imprint apparatus in Step S1102 will be described in more detail. In the second embodiment, a region, which includes the substrate mark 7, other than the pattern region is irradiated with the ultraviolet light 10. Since the used substrate mark 7 has a size of about 10 μm at least, it is only necessary for precision of the position of the irradiation with the ultraviolet light to be about several μm. It is thus possible to harden the imprint material 3 at the predetermined position by continuously or intermittently perform irradiation a plurality of times while moving one optical unit that is smaller than the substrate mark 7. Also, the number of optical units is not limited to one, and a plurality of optical units for irradiation with an ultraviolet LED, for example, may be configured, and these may be driven to the substrate mark 7 to collectively or successively repeat the irradiation with the ultraviolet light.

Figure 12A:
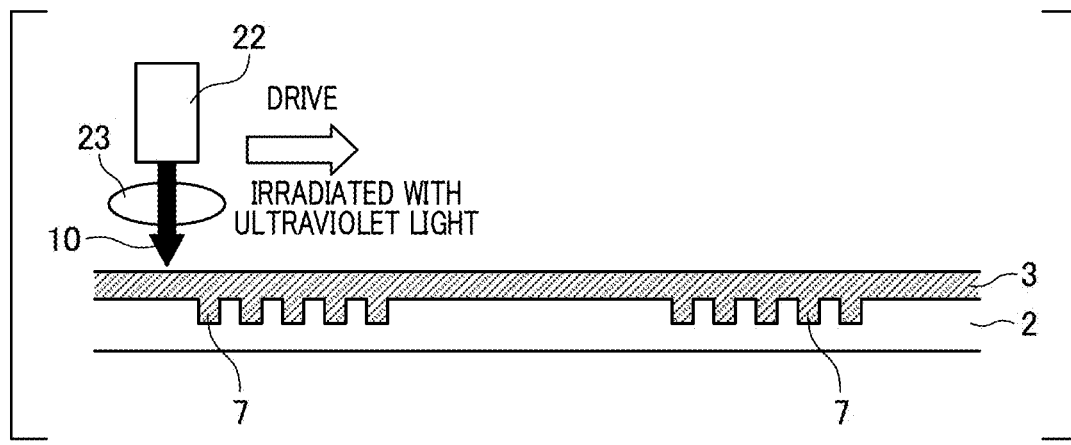
FIGS. 12A to 12C are diagrams illustrating a unit configuration for irradiation with ultraviolet light in the second embodiment.
Figure 12B:
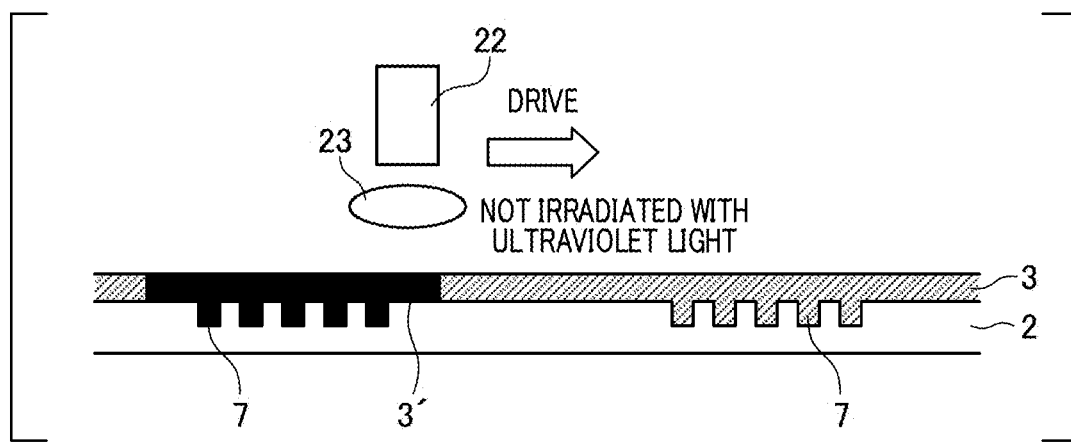
Figure 12C:
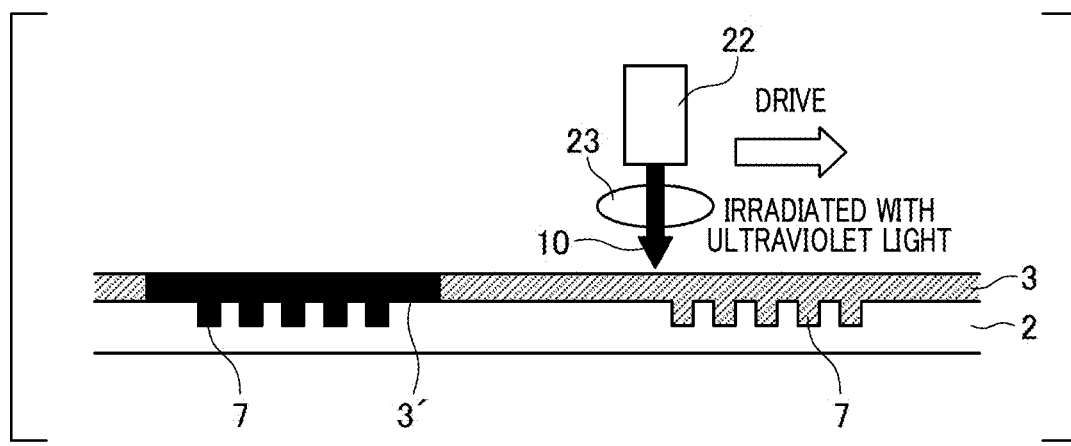

FIGS. 12A to 12C illustrate how the irradiation with the ultraviolet light 10 is performed in the imprint apparatus in Step S1102.

Since it is preferable that the ultraviolet light irradiation unit be as small as possible, only a small-sized light source 22 and an optical element 23 for narrowing the ultraviolet light 10 are illustrated in FIGS. 12A to 12C. The small-sized light source 22 may be an actual small-sized light source such as an ultraviolet LED or may be an emission end guided from a separately configured light source through an optical fiber or the like. The optical element 23 is a member for controlling the size and the shape of the beam of the ultraviolet light 10 with which the substrate 2 is illuminated and includes a lens, a field diaphragm, and the like. Although FIGS. 12A to 12C illustrate a form in which the ultraviolet light irradiation unit is driven, the substrate 2 may be driven up to a position at which the substrate 2 faces the ultraviolet light irradiation unit. The ultraviolet light irradiation unit is driven up to a desired substrate mark 7 on the basis of information regarding the substrate mark 7 obtained in advance. Once the ultraviolet light irradiation unit is driven up to the desired position of the substrate mark 7, irradiation with the ultraviolet light 10 is started. FIG. 12A illustrates how the operation at this time is performed. FIGS. 12A to 12C illustrate a configuration in which a desired region is irradiated by driving the ultraviolet light irradiation unit during the irradiation. Note that if the ultraviolet light irradiation unit has a sufficiently large irradiation region, it is not necessary to perform scanning, and it is only necessary to repeat the moving step and the irradiation.

Once the irradiation of the desired region ends, the ultraviolet light irradiation unit is driven up to a position of the next substrate mark 7 which is to be irradiated. At this time, the irradiation of the ultraviolet light 10 is not performed while moving above portions other than the substrate mark 7. FIG. 12B illustrates how the operation at this time is performed.

Then, once the ultraviolet light irradiation unit is moved up to the position of the next substrate mark 7 on which irradiation is to be performed, then the ultraviolet light irradiation unit is driven while irradiation with the ultraviolet light 10 is performed again. FIG. 12C illustrates how the operation at this time is performed. Since it is not necessary to drive the substrate 2 and only a small space is needed to perform these processes by using the aforementioned method, a size reduction of the apparatus can be achieved.

Also, the irradiation method is not limited thereto, and an optical system or the like including a DMD as illustrated in the first embodiment may be configured.

It is desirable that the viscosity increasing process through irradiation of the substrate mark 7 with ultraviolet light or the like in the second embodiment be performed at a position different from the position of the substrate stage 1 on which the substrate 2 is placed at the time of imprint in order to enhance producibility. For example, the position at which the substrate 2 waits before installation on the substrate stage 1 corresponds thereto.

Returning to FIG. 11, the processing proceeds to S1103 next. However, since S1103 to S1107 are similar to steps S804 to S808 illustrated using FIG. 8, description thereof will be omitted.

As described above, it is possible to perform the viscosity increasing process through the irradiation of the portion of the substrate mark 7 with the ultraviolet light 10 or the like in the region that is different from the region in which the imprinting process is performed according to the second embodiment. Also, since the imprinting process is performed similarly to the related art, the number of processes is partially reduced without leading to a decrease in producibility, and it is thus possible to improve a throughput.

Note that it is important to harden the imprint material 3 or to increase the viscosity thereof in the region, which includes the substrate mark 7, other than the pattern region. Therefore, applying heat in a case of a thermosetting resin similarly to the first embodiment or additionally dropping the imprint material 24 with higher viscosity is also effective to continuously observe the mold mark 6.

Third Embodiment

Figure 13:
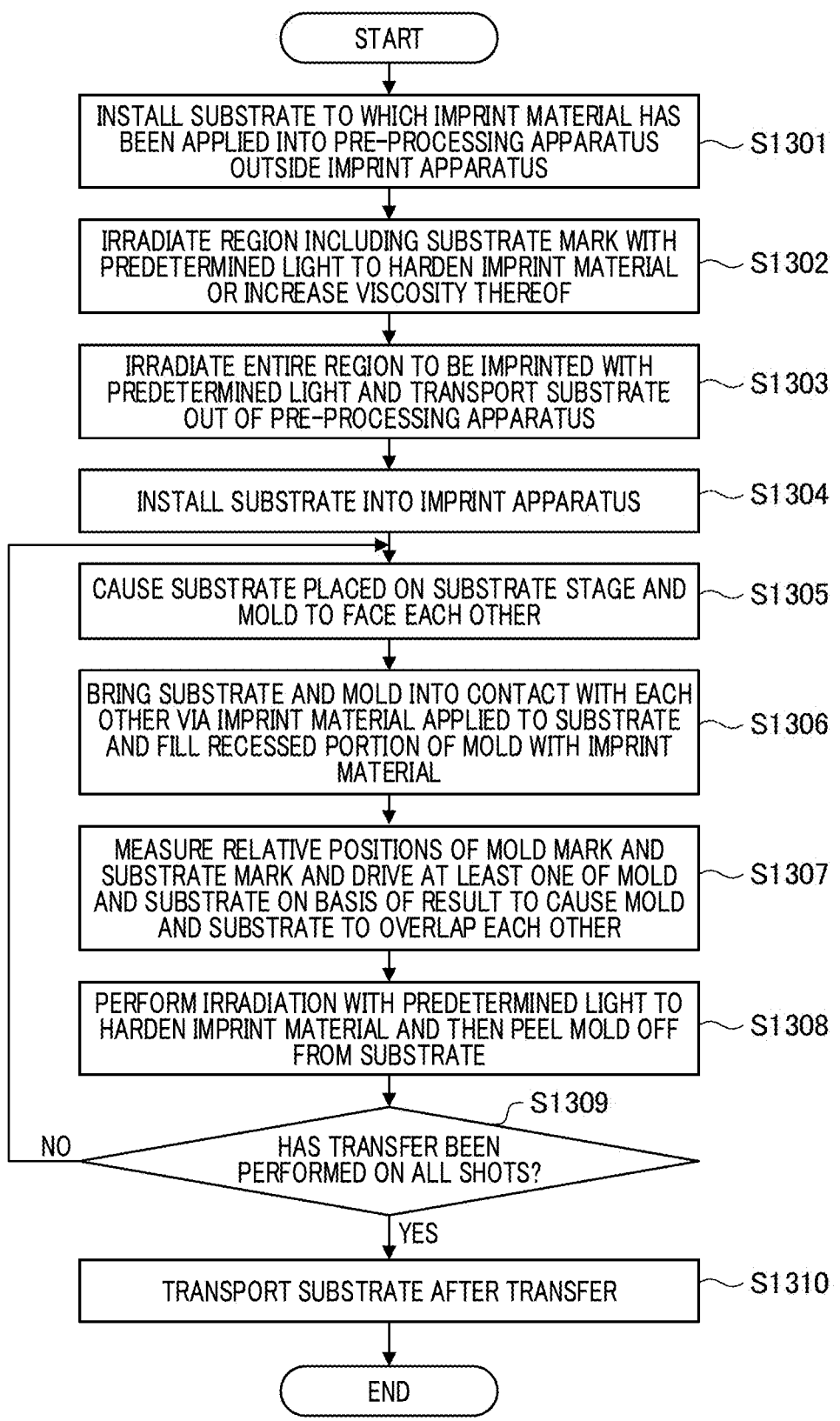
FIG. 13 is a flowchart according to a third embodiment.

FIG. 13 is a flowchart of an exposure method for increasing the viscosity through irradiation with ultraviolet light 10 outside the imprint apparatus or the like according to a third embodiment. The third embodiment will be described on the basis of FIG. 13. Note that the operations (processing) illustrated in the flowchart in FIG. 13 are controlled by the control unit 11 executing a computer program.

First, in Step S1301, a substrate 2 to which an imprint material 3 has been applied is installed in an apparatus (pre-processing apparatus) outside the imprint apparatus. Next, in Step S1302, the imprint material 3 at a predetermined position, which includes the position of a substrate mark 7 that is a predetermined mark, other than a pattern region is irradiated with light with a predetermined wavelength to completely harden the imprint material 3 or increase the viscosity thereof (viscosity increasing process). In this case, the viscosity is increased to be higher than the viscosity of the imprint material 3 in the pattern region. Next, in Step S1303, the entire region to be imprinted is irradiated with predetermined light, and the substrate 2 is transported out of the pre-processing apparatus after the irradiation ends.

Next, in Step S1304, the substrate 2 after ending the pre-processing is installed in the imprint apparatus. Then, the processing proceeds to S1305. However, since Steps S1305 to S1310 are similar to Steps S602 to S607 illustrated using FIG. 6, description thereof will be omitted.

As described above, the substrate 2 to which the imprint material 3 has been applied is prepared in advance to be used in an imprint apparatus or the like having a section adapted to bring a patterned portion of a mold 4 into contact with the imprint material 3 in a predetermined pattern region on the substrate 2 to form a pattern in the third embodiment. Note that it is assumed that the imprint material 3 is applied to the entire surface of the substrate 2 in the third embodiment. Also, the pre-processing apparatus is used to pretreat the substrate 2 before the substrate 2, to which the imprint material 3 has been applied, is installed in the imprint apparatus. In the pre-processing apparatus, a reticle (original plate) that conforms to the used substrate 2 is prepared before the pattern is formed on the imprint material 3 on the substrate 2 using a contact section of the imprint apparatus. In addition, a viscosity increasing section adapted to increase the viscosity of the imprint material 3 at the predetermined position, which includes the position of the predetermined mark provided on the substrate 2, other than the pattern region to be higher than the viscosity of the imprint material 3 in the pattern region is included. Examples of the used apparatus include an i-beam lithography apparatus. Since the region irradiated with the ultraviolet light 10 is of a μm order as described above, it is not necessary to perform fine positioning control. Thus, the i-beam lithography apparatus with high producibility is effectively used. It is a matter of course that another type of lithography apparatus or the optical system according to the first or second embodiment as a dedicated machine of this case may be provided outside the imprint apparatus. Also, the pre-processing apparatus as described above, for example, may be provided inside or outside the imprint apparatus.

The viscosity increasing processing to harden the imprint material 3 or increase the viscosity thereof in the region including the substrate mark 7 is performed in a stage prior to the installation into the imprint apparatus, that is, a stage in which the substrate for imprinting is manufactured using the pre-processing apparatus. The substrate for imprinting is manufactured through the viscosity increasing processing, and the substrate 2 is then installed in the imprint apparatus. After the substrate 2 is installed into the imprint apparatus, the substrate 2 is treated in the hardening process, and the post processing is then performed on the substrate 2 including the imprint material 3.

Note that it is important to harden the imprint material 3 or to increase the viscosity thereof in the region, which includes the substrate mark 7, other than the pattern region. Therefore, applying heat in a case of a thermosetting resin similarly to the first embodiment or additionally dropping the imprint material 24 with higher viscosity is also effective to continuously observe the mold mark 6.

(Embodiment of Article Manufacturing Method)

A method for manufacturing an article according to this embodiment is suitable for manufacturing an article such as a microdevice including a semiconductor device or an element with a fine structure, for example. The method for manufacturing an article according to this embodiment includes a process for forming a pattern on an imprint material applied to a substrate using the aforementioned imprint apparatus (a process for performing imprint processing on the substrate) and a process for working the substrate on which a pattern has been formed in such a process. Further, such a manufacturing method includes other known processes (oxidation, film formation, deposition, doping, flattening, etching, composition peeling, dicing, bonding, packaging, and the like). The method for manufacturing an article according to this embodiment is advantageous in terms of at least one of performance, quality, producibility, and manufacturing costs of the article as compared with the method in the related art.

The pattern of a hardened object shaped using the imprint apparatus is permanently used at least as a part of various articles or is temporarily used when various articles are manufactured. The articles include an electric circuit element, an optical element, an MEMS, a recording element, a sensor, a mold, or the like. Examples of the electric circuit element includes volatile or non-volatile semiconductor memories such as a DRAM, an SRAM, a flash memory, and an MRAM and semiconductor elements such as an LSI, a CCD, an image sensor, and an FPGA. Examples of the mold include a mold for imprint.

The pattern of the hardened object is directly used as at least a partial component of the aforementioned article or is temporarily used as a composition mask. After etching, ion injection, or the like is performed in the substrate working process, the composition mask is removed.

Figure 14A:
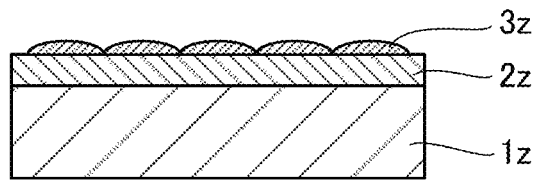
FIGS. 14A to 14F are diagrams illustrating an example of a method of manufacturing an article.

Next, a specific method for manufacturing an article will be described with reference to FIG. 14. As illustrated in FIG. 14A, a substrate 1*z* such as a silicon substrate with a surface on which a working target material 2*z* such as an insulating element is formed is prepared, and an imprint material 3*z* is then applied to the surface of the working target material 2*z* by an inkjet method or the like. Here, how the imprint material 3*z* in the form of a plurality of liquid droplets has been applied onto the substrate is illustrated.

Figure 14B:
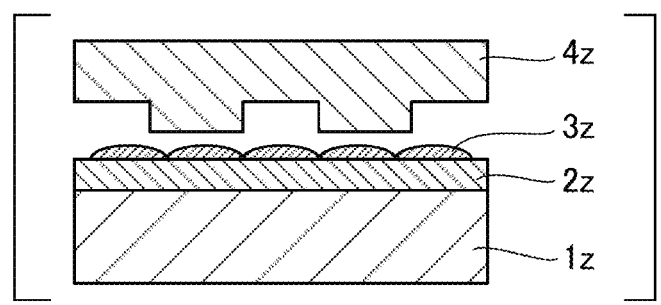
Figure 14C:
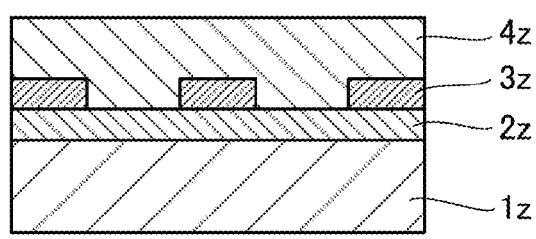

As illustrated in FIG. 14B, a side of a mold 4*z* for imprint on which an uneven pattern has been formed is directed to and is caused to face the imprint material 3*z* on the substrate. As illustrated in FIG. 14C, the substrate 1*z* to which the imprint material 3*z* has been applied and the mold 4*z* are brought into contact with each other, and a pressure is applied thereto. The clearance between the mold 4*z* and the working target material 2*z* is filled with the imprint material 3*z*. If irradiation with light as an energy for hardening is performed through the mold 4*z* in this state, then the imprint material 3*z* is hardened.

Figure 14D:
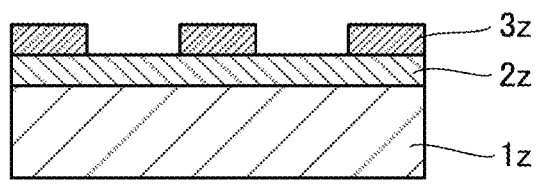

As illustrated in FIG. 14D, if the mold 4*z* is pulled and peeled off from the substrate 1*z* after the imprint material 3*z* is hardened, then the pattern of the hardened object of the imprint material 3*z* is formed on the substrate 1*z*. The pattern of the hardened object has a shape in which the recessed portion of the mold corresponds to a projecting portion of the hardened object while the projecting portion of the mold corresponds to the recessed portion of the hardened object. In other words, the uneven pattern of the mold 4*z* is transferred to the imprint material 3*z*.

Figure 14E:
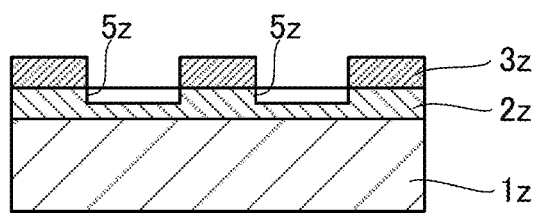
Figure 14F:
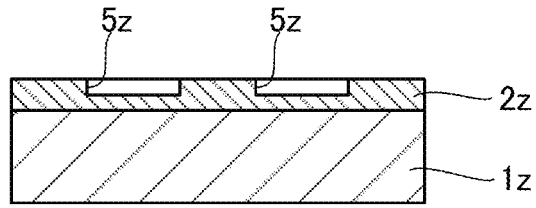

As illustrated in FIG. 14E, if etching is performed using the pattern of the hardened object as an etching-resistant mask, a portion that has no hardened object or has a thinly remaining hardened object in the surface of the working target material 2*z* is removed, and a groove 5*z* is obtained. As illustrated in FIG. 14F, if the pattern of the hardened object is removed, it is thus possible to obtain an article with the groove 5*z* formed on the surface of the working target material 2*z*. Although the pattern of the hardened object is removed here, the pattern may not be removed after working and may be used as an interlayer insulating film included in a semiconductor element or the like, that is, a component of the article, for example. Note that although the example in which a mold for transferring a circuit pattern provided with an uneven pattern is used as the mold 4*z* has been described above, the mold 4*z* may be a flat plane template having a flat plane portion with no uneven pattern.

Also, a computer program that realizes the functions of the aforementioned embodiment describing a part or an entirety of the control in the aforementioned embodiments may be supplied to an imprint apparatus or the like via a network or various storage media. Then, a computer (or a CPU, an MPU, or the like) in the imprint apparatus or the like may read and execute the program. In this case, the program and the recording media storing the program also configure the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-157234, filed Aug. 29, 2019, which is hereby incorporated by reference wherein in its entirety.

What is claimed is:

1. An imprinting method comprising:
    supplying an imprint material onto a substrate including a shot region;
    bringing a patterned portion of a mold into contact with the imprint material, which has been supplied onto the shot region of the substrate in the supplying of the imprint material, to form a pattern on the imprint material in a predetermined pattern region of the shot region on the substrate; and
    increasing a viscosity of the imprint material at a predetermined position in the shot region, the predetermined position including a position of a predetermined mark provided on the substrate and being disposed outside the predetermined pattern region of the shot region, to be higher than a viscosity of the imprint material in the predetermined pattern region of the shot region after the supplying of the imprint material onto the predetermined position in the shot region and before the bringing of the patterned portion of the mold into contact with the imprint material on the shot region.

2. The imprinting method according to claim 1, wherein the increasing of the viscosity includes any of irradiating the imprint material at the predetermined position in the shot region with light with a predetermined wavelength, applying heat to the imprint material at the predetermined position in the shot region, supplying an imprint material to the predetermined position in the shot region, with a higher viscosity than viscosity of the imprint material that has been supplied in the supplying of the imprint material, and supplying a compound that promotes polymerization of the imprint material at the predetermined position in the shot region that has been supplied in the supplying of the imprint material.

3. The imprinting method according to claim 1, further comprising hardening the imprint material on the substrate by irradiating the imprint material with light with a predetermined wavelength after the bringing of the patterned portion of the mold into contact with the imprint material on the shot region.

4. The imprinting method according to claim 3, wherein, in the hardening of the imprint material, an amount of irradiation obtained by adding an amount of irradiation of the predetermined position in the shot region on the substrate, which has been irradiated in the increasing of the viscosity, with the light with the predetermined wavelength and an amount of irradiation of the predetermined position in the shot region, which has been irradiated in the hardening of the imprint material, with the light with the predetermined wavelength is set to be equal to or greater than an amount of irradiation of the imprint material in the predetermined pattern region of the shot region in the hardening of the imprint material.

5. The imprinting method according to claim 4, further comprising increasing viscosity of the imprint material in an outer peripheral portion of the predetermined pattern region of the shot region to be higher than the viscosity of the imprint material in the predetermined pattern region of the shot region inside the outer peripheral portion before the hardening of the imprint material.

6. The imprinting method according to claim 5, further comprising positioning the predetermined mark on the substrate relative to the mold before the hardening of the imprint material.

7. The imprinting method according to claim 1, wherein the increasing of the viscosity is performed in a state in which the mold and the substrate face each other.

8. The imprinting method according to claim 1, wherein the increasing of the viscosity is performed in a state in which the mold and the substrate do not face each other.

9. The imprinting method according to claim 8, wherein the increasing of the viscosity is performed before installation of the substrate in an imprint apparatus to perform the bringing of the patterned portion into contact with the imprint material.

10. The imprinting method according to claim 1, wherein the mold at a position facing the predetermined mark on the substrate is provided with a mold mark having an uneven pattern, and the viscosity of the imprint material at the position of the predetermined mark on the substrate is increased in the increasing of the viscosity such that a recessed portion of the mold mark is unlikely to be filled with the imprint material when the mold mark is brought into contact with the imprint material in the bringing of the patterned portion of the mold into contact with the imprint material.

11. The imprinting method according to claim 10, wherein the viscosity of the imprint material at the predetermined position is increased in the increasing of the viscosity to achieve such viscosity that the recessed portion of the mold mark is not fully filled with the imprint material even after twice the time required to form the pattern by bringing the patterned portion of the mold into contact with the imprint material in the predetermined pattern region of the shot region on the substrate elapses in the bringing of the patterned portion of the mold into contact with the imprint material.

12. A method for manufacturing a substrate, comprising:
    supplying an imprint material onto a substrate including a shot region;
    bringing a patterned portion of a mold into contact with the imprint material, which has been supplied onto the shot region of the substrate in the supplying of the imprint material, to form a pattern on the imprint material in a predetermined pattern region of the shot region on the substrate;
    increasing a viscosity of the imprint material at a predetermined position in the shot region, the predetermined position including a position of a predetermined mark provided on the substrate and being disposed outside the predetermined pattern region of the shot region, to be higher than a viscosity of the imprint material in the predetermined pattern region of the shot region after the supplying of the imprint material onto the predetermined position in the shot region and before the bringing of the patterned portion of the mold into contact with the imprint material on the shot region;
    hardening the imprint material on the substrate by irradiating the imprint material on the shot region with light with a predetermined wavelength after the bringing of the patterned portion of the mold into contact with the imprint material on the shot region; and performing posttreatment on the substrate including the imprint material that has been hardened in the hardening of the imprint material.

* * * * *